United States Patent
Kosaka et al.

(10) Patent No.: US 10,146,122 B2
(45) Date of Patent: Dec. 4, 2018

(54) HALFTONE PHASE SHIFT PHOTOMASK BLANK AND MAKING METHOD

(71) Applicant: SHIN-ETSU CHEMICAL CO., LTD., Tokyo (JP)

(72) Inventors: Takuro Kosaka, Joetsu (JP); Yukio Inazuki, Joetsu (JP); Hideo Kaneko, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/403,436

(22) Filed: Jan. 11, 2017

(65) Prior Publication Data

US 2017/0212417 A1 Jul. 27, 2017

(30) Foreign Application Priority Data

Jan. 22, 2016 (JP) ................................. 2016-010666

(51) Int. Cl.
*G03F 1/32* (2012.01)
*G03F 1/68* (2012.01)

(52) U.S. Cl.
CPC . *G03F 1/32* (2013.01); *G03F 1/68* (2013.01)

(58) Field of Classification Search
CPC .................................... G03F 1/32; G03F 1/68
USPC ......................................................... 430/5
See application file for complete search history.

(56) References Cited

U.S. PATENT DOCUMENTS

| | | |
|---|---|---|
| 5,474,864 A | 12/1995 | Isao et al. |
| 7,179,545 B2 | 2/2007 | Okazaki et al. |
| 7,767,366 B2 | 8/2010 | Yoshikawa et al. |
| 7,771,893 B2 | 8/2010 | Yoshikawa et al. |
| 7,941,767 B2 | 5/2011 | Mukai et al. |
| 2004/0191646 A1 | 9/2004 | Yoshikawa et al. |
| 2015/0104735 A1 | 4/2015 | Umezawa et al. |

FOREIGN PATENT DOCUMENTS

| | | |
|---|---|---|
| EP | 2 568 335 A2 | 3/2013 |
| EP | 3 086 174 A1 | 10/2016 |
| JP | 7-140635 A | 6/1995 |
| JP | 2004-133029 A | 4/2004 |
| JP | 2007-33469 A | 2/2007 |
| JP | 2007-233179 A | 9/2007 |
| JP | 2007-241065 A | 9/2007 |
| JP | 2008-276002 A | 11/2008 |

OTHER PUBLICATIONS

Faure et al., "Characterization of Binary and Attenuated Phase Shift Mask Blanks for 32nm Mask Fabrication", Photomask Technology 2008, Proc. of SPIE, vol. 7122, 712209-1-712209-12.

Extended European Search Report dated Jun. 20, 2017, in European Patent Application No. 17150778.3.

*Primary Examiner* — Christopher G Young
(74) *Attorney, Agent, or Firm* — Birch, Stewart, Kolasch & Birch, LLP

(57) ABSTRACT

A halftone phase shift film is formed on a transparent substrate by reactive sputtering using a silicon target, an inert gas, and a nitrogen-containing reactive gas. A hysteresis curve is drawn by sweeping the flow rate of the reactive gas, and plotting the sputtering voltage or current during the sweep versus the flow rate of the reactive gas. In a transition mode sputtering step of sputtering in a region corresponding to a range from more than the lower limit of reactive gas flow rate providing the hysteresis to less than the upper limit, the target power, the inert gas flow rate and/or the reactive gas flow rate is increased or decreased continuously or stepwise.

8 Claims, 4 Drawing Sheets

HALFTONE PHASE SHIFT PHOTOMASK BLANK AND MAKING METHOD

CROSS-REFERENCE TO RELATED APPLICATION

This non-provisional application claims priority under 35 U.S.C. § 119(a) on Patent Application No. 2016-010666 filed in Japan on Jan. 22, 2016, the entire contents of which are hereby incorporated by reference.

TECHNICAL FIELD

This invention relates to a halftone phase shift photomask blank which is processed into a halftone phase shift photomask for use in the microfabrication of semiconductor integrated circuits or the like, and a method for preparing the same.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of providing a phase shift of approximately 180 degrees and having an insufficient transmittance to contribute to pattern formation. As the halftone phase shift photomask, Patent Document 1 proposes a photomask having a halftone phase short film of molybdenum silicide oxide (MoSiO) or molybdenum silicide oxynitride (MoSiON).

For the purpose of forming finer images by photolithography, light of shorter wavelength is used as the light source. In the currently most advanced stage of lithography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form, on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, Patent Document 2 describes that if the photomask is cleaned at a predetermined stage, then it can be continuously used.

As the exposure dose of ArF excimer laser light irradiated for pattern transfer increases, the photomask is given damage different from haze; and the line width of the mask pattern changes in accordance with the cumulative irradiation energy dose, as reported in Non-Patent Document 1. This problem is that as the cumulative irradiation energy dose increases during long-term irradiation of ArF excimer laser light, a layer of a substance which is considered to be an oxide of the pattern material grows outside the film pattern, whereby the pattern width changes. It is also reported that the mask once damaged cannot be restored by cleaning with APM (aqueous ammonia/hydrogen peroxide) as used in the above-mentioned haze removal or with SPM (sulfuric acid/hydrogen peroxide). It is believed that the damage source is utterly different.

Non-Patent Document 1 points out that upon exposure of a circuit pattern through a halftone phase shift photomask which is the mask technology useful in expanding the depth of focus, substantial degradation is induced by pattern size variation resulting from alteration of a transition metal/silicon base material film such as MoSi base material film by irradiation of ArF excimer laser light (this degradation is referred to as "pattern size variation degradation"). Then, in order to use an expensive photomask over a long period of time, it is necessary to address the pattern size variation degradation by irradiation of ArF excimer laser light.

The pattern size variation degradation by irradiation of ArF excimer laser light scarcely occurs when light is irradiated in a dry air atmosphere, as reported in Non-Patent Document 1. Then the exposure in dry air is considered a new countermeasure for preventing pattern size variation degradation. For control in a dry air atmosphere, however, extra equipment and an electrostatic countermeasure are newly needed, inviting a cost increase. It is thus necessary to enable long-term exposure in a common atmosphere (e.g., humidity ~50%) without a need for complete removal of moisture.

Of the photomasks used in the lithography using ArF excimer laser light as the energy source, the halftone phase shift photomasks generally use transition metal/silicon base materials, typically molybdenum-containing silicon base materials. The transition metal/silicon base materials are composed mainly of transition metal and silicon and optionally contain light elements such as nitrogen and/or oxygen (e.g., Patent Document 1) and traces of carbon and hydrogen. As the transition metal, molybdenum, zirconium, tantalum, tungsten and titanium are generally used. Typically, molybdenum is used (see Patent Document 1), and sometimes, a second transition metal is added (see Patent Document 3). Also in the light-shielding film, the transition metal/silicon base materials, typically molybdenum-containing silicon base materials are used.

However, when the photomask of such transition metal/silicon base material is exposed to a large dose of high-energy radiation, a substantial pattern size variation degradation occurs by irradiation of high-energy radiation, suggesting that the lifetime of the photomask becomes shorter than the requirement. It is a serious problem that when the photomask pattern of a transition metal/silicon base material film is exposed to ArF excimer laser radiation, the photomask pattern for exposure experiences a change of line width.

Citation List

Patent Document 1: JP-A H07-140635
Patent Document 2: JP-A 2008-276002 (U.S. Pat. No. 7,941,767)
Patent Document 3: JP-A 2004-133029
Patent Document 4: JP-A 2007-033469
Patent Document 5: JP-A 2007-233179
Patent Document 6: JP-A 2007-241065
Non-Patent Document 1: Thomas Faure et al., "Characterization of binary mask and attenuated phase shift mask blanks for 32 nm mask fabrication," Proc. of SPIE, vol. 7122, pp 712209-1 to 712209-12

SUMMARY OF INVENTION

The photomask technology has the tendency that with a progress of miniaturization, the pattern width becomes smaller than the wavelength of exposure light. Accordingly, RET technologies such as OPC, modified illumination, immersion lithography, phase shift method, and double exposure are employed as mentioned above. With respect to the phase shift film, a thinner film is advantageous for pattern formation and effective for reducing 3D effect. For photolithography, a thinner film is required in order to form a finer size pattern.

On use of a photomask blank in the photomask producing process, if foreign deposits are on the photomask blank, they cause pattern defects. To remove foreign deposits, the photomask blank is cleaned many times during the photomask producing process. Further, when the resulting photomask is used in the photolithography process, the photomask is also repeatedly cleaned even if the photomask as produced is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or APM. SPM is a sulfuric acid/hydrogen peroxide mixture which is a cleaning agent having strong oxidizing action. Ozone water is water having ozone dissolved therein and used as a replacement of SPM. APM is an aqueous ammonia/hydrogen peroxide mixture. When the photomask blank or photomask having organic foreign deposits on its surface is immersed in the APM cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage an optical film, typically halftone phase shift film, on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film during every cleaning step. Among the films meeting the above requirements are films comprising silicon and nitrogen and/or oxygen, for example, transition metal-free films consisting of silicon and nitrogen, and transition metal-free films consisting of silicon, nitrogen and oxygen, which have improved chemical resistance.

In general, a thin film for forming a pattern on a photomask blank is deposited by the sputtering method. For example, a film consisting of silicon and nitrogen (SiN film) is formed on a transparent substrate by a sputtering process which involves the steps of placing a silicon target in a deposition chamber, feeding a gas mixture of a rare gas such as argon and nitrogen gas to the chamber, applying an electric power to create a gas plasma, and letting the plasma atoms impinge the silicon target to sputter silicon particles. Then silicon particles react with nitrogen on their way or with nitrogen on the target surface or with nitrogen on the substrate. The resulting silicon nitride deposits on the substrate. The nitrogen content of the SiN film is controlled by changing the mixing ratio of nitrogen gas in the gas mixture. The process enables to deposit a SiN film having any desired nitrogen content on a transparent substrate.

When a SiN film is deposited using a silicon target, however, stable film deposition becomes difficult in a certain region, depending on the flow rate of nitrogen gas in the gas mixture. In that region, it is difficult to control the optical properties of the film including phase shift and transmittance. In particular, it is difficult to form a film having in-plane uniformity of optical properties at a predetermined transmittance while maintaining a predetermined phase shift, e.g., a phase shift of approximately 180°.

An object of the invention is to provide a halftone phase shift photomask blank comprising a halftone phase shift film containing silicon and nitrogen and having in-plane uniformity of optical properties, and a method for preparing the photomask blank.

The invention is directed to a method for preparing a halftone phase shift photomask blank having a halftone phase shift film on a transparent substrate, the method comprising the step of depositing a layer containing silicon and nitrogen on the transparent substrate, as a part or the entirety of the halftone phase shift film, by reactive sputtering using a silicon-containing target, an inert gas, and a nitrogen-containing reactive gas. It is assumed that a hysteresis curve is drawn by applying a power across the target, feeding the reactive gas into a chamber, increasing and then decreasing the flow rate of the reactive gas for thereby sweeping the flow rate of the reactive gas, measuring a sputtering voltage or current value upon sweeping of the flow rate of the reactive gas, and plotting the sputtering voltage or current value versus the flow rate of the reactive gas; and that the sputtering step of sputtering in a (metal) region corresponding to a range equal to of less than the lower limit of reactive gas flow rate providing the hystoresis is referred to as "metal mode", the sputtering step of sputtering in a (transition) region corresponding to a range from more than the lower limit of reactive gas flow rate providing the hysteresis to less than the upper limit is referred to as "transition mode", and the sputtering step of sputtering in a (reaction) region corresponding to a range equal to or more than the upper limit of reactive gas flow rate providing the hysteresis is referred to as "reaction mode". According to the invention, in a part or the entirety of the transition mode sputtering step, at least one parameter selected from the power applied across the target, the flow rate of the inert gas, and the flow rate of the reactive gas, especially the flow rate of the reactive gas is increased or decreased continuously or stepwise, preferably continuously, preferably such that the layer containing silicon and nitrogen is compositionally graded in thickness direction. Particularly in the entirety of the transition mode sputtering step, the at least one parameter is increased or decreased continuously. Then there is obtained a halftone phase shift film having the desired values of phase shift and transmittance and improved uniformity of in-plane distribution of phase shift and transmittance. That is, a halftone phase shift film having satisfactory in-plane uniformity of optical properties can be deposited on a transparent substrate in a reproducible manner.

Accordingly, in one aspect, the invention provides a method for preparing a halftone phase shift photomask blank having a halftone phase shift film on a transparent substrate, the method comprising the step of depositing a layer containing silicon and nitrogen on the transparent substrate, as a part or the entirety of the halftone phase shift film, by reactive sputtering using a silicon-containing target, an inert gas, and a nitrogen containing reactive gas. Provided that a hysteresis curve is drawn by applying a power across the target, feeding the reactive gas into a chamber, increasing and then decreasing the flow rate of the reactive gas for thereby sweeping the flow rate of the reactive gas, measuring a sputtering voltage or current value upon sweeping of the flow rate of the reactive gas, and plotting the sputtering voltage or current value versus the flow retie of the reactive gas, the step of depositing a layer containing silicon and nitrogen includes a transition mode sputtering step of sputtering in a region corresponding to a range from more than the lower limit of reactive gas flow rate providing the hysteresis to less than the upper limit, and in a part or the entirety of the transition mode sputtering step, at least one parameter selected from the power applied across the target, the flow rate of the inert gas, and the flow rate of the reactive gas is increased or decreased continuously or stepwise.

Preferably, in the transition mode sputtering step, sputtering is carried out while at least one parameter selected from the power applied across the target, the flow rate of the inert gas, and the flow rate of the reactive gas is increased or decreased continuously such that the layer containing silicon and nitrogen may be compositionally graded in thickness direction.

Preferably, in the entirety of the transition mode sputtering step, sputtering is carried out while at least one parameter selected from the power applied across the target, the flow rate of the inert gas, and the flow rate of the reactive gas is increased or decreased continuously.

Preferably, in the transition mode sputtering step, sputtering is carried out while the flow rate of the reactive gas is increased or decreased.

Preferably, the step of depositing a layer containing silicon and nitrogen includes a reaction mode sputtering step of sputtering in a region corresponding to a range equal to or more than the upper limit of reactive gas flow rate providing the hysteresis, and the transition mode sputtering step is followed by the reaction mode sputtering step, or the reaction mode sputtering step is followed by the transition mode sputtering step.

Preferably, in a part or the entirety of the reaction mode sputtering step, sputtering is carried out while at least one parameter selected from the power applied across the target, the flow rate of the inert gas, and the flow rate of the reactive gas is increased or decreased continuously or stepwise.

Preferably, from the transition mode sputtering step to the reaction mode sputtering step, or from the reaction mode sputtering step to the transition mode sputtering step, sputtering is carried out while at least one parameter selected from the power applied across the target, the flow rate of the inert gas, and the flow rate of the reactive gas is increased or decreased continuously.

Preferably, the step of depositing a layer containing silicon and nitrogen includes a metal mode sputtering step of sputtering in a region corresponding to a range equal to or less than the lower limit of reactive gas flow rate providing the hysteresis, and the metal mode sputtering step is followed by the transition mode sputtering step, or the transition mode sputtering step is followed by the metal mode sputtering step.

Preferably, in a part or the entirety of the metal mode sputtering step, sputtering is carried out while at least one parameter selected from the power applied across the target, the flow rate of the inert gas, and the flow rate of the reactive gas is increased or decreased continuously or stepwise.

Preferably, from the metal mode sputtering step to the transition mode sputtering step, or from the transition mode sputtering step to the metal mode sputtering step, sputtering is carried out while at least one parameter selected from the power applied across the target, the flow rate of the inert gas, and the flow rate of the reactive gas is increased or decreased continuously.

In preferred embodiments, the silicon-containing target is a silicon target; the inert gas is argon gas; the reactive gas is nitrogen gas; the layer containing silicon and nitrogen is composed of SiN.

In another aspect, the invention provides a halftone phase shift photomask blank comprising a transparent substrate and a halftone phase shift film formed thereon, wherein the halftone phase shift film includes as a part or the entirety thereof a layer containing silicon and nitrogen, the layer includes a region where an atomic ratio of nitrogen to the sum of silicon and nitrogen, N/(Si+N), continuously varies in a range between 0.25 and 0.57 in thickness direction.

Another embodiment of the invention is a halftone phase shift photomask blank comprising a transparent substrate and a halftone phase shift film formed thereon, wherein the halftone phase shift film includes as a part or the entirety thereof a layer containing silicon and nitrogen, exhibits a phase shift of 170 to 190° and a transmittance of 2 to 15% with respect to exposure light of wavelength 193 nm, a difference between maximum and minimum in phase shift in-plane distribution being up to 3°, and a difference between maximum and minimum in transmittance in-plane distribution being up to 5% based on in-plane average value, and the halftone phase shift film has a thickness of up to 67 nm. In a preferred embodiment, the layer containing silicon and nitrogen includes a region where an atomic ratio of nitrogen to the sum of silicon and nitrogen continuously varies in thickness direction.

In a preferred embodiment, the layer containing silicon and nitrogen includes a region where the atomic ratio of nitrogen to the sum of silicon and nitrogen, N/(Si+N), continuously varies in a range between 0.25 and 0.57 in thickness direction. In a further preferred embodiment, the layer containing silicon and nitrogen includes a region where the atomic ratio of nitrogen to the sum of silicon and nitrogen, N/(Si+N), continuously varies in a range between 0.34 and 0.54 in thickness direction.

Also preferably, in the layer containing silicon and nitrogen, the difference between maximum and minimum of the atomic ratio of nitrogen to the sum of silicon and nitrogen, N/(Si+N), in thickness direction is up to 0.25.

Typically, the layer containing silicon and nitrogen is composed of SiN.

Advantageous Effects of Invention

The halftone phase shift photomask blank comprises a halftone phase shift film including a layer containing silicon and nitrogen and having chemical resistance. The halftone phase shift film is improved in in-plane uniformity of optical properties while maintaining the predetermined values of phase shift and transmittance.

DESCRIPTION OF PREFERRED EMBODIMENTS

Figure 1A:
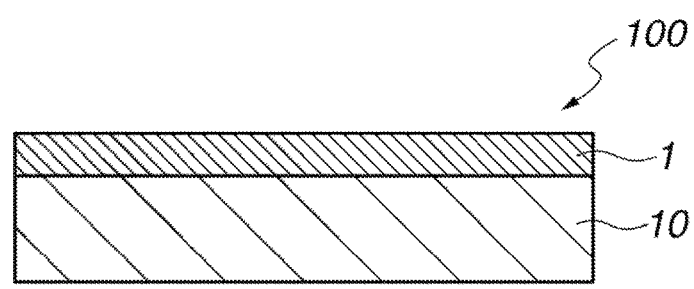
FIGS. 1A and 1B are cross-sectional views of one exemplary halftone phase shift photomask blank and a corresponding halftone phase shift photomask of the invention, respectively.

According to the invention, a halftone phase shift photomask blank is prepared by reactive sputtering of a silicon-containing target with an inert gas and a reactive gas containing nitrogen to deposit a layer containing silicon and nitrogen as a part or the entirety of a halftone phase shift film on a transparent substrate. In the step of depositing the layer containing silicon and nitrogen, the depositing or sputtering conditions are set on the basis of a hysteresis curve that is drawn by applying a power across the target, feeding the reactive gas into a chamber, increasing and then decreasing the flow rate of the reactive gas for thereby sweeping the flow rate of the reactive gas, measuring a sputtering voltage or current value (target voltage or current value) upon sweeping of the flow rate of the reactive gas, and plotting the sputtering voltage or current value versus the flow rate of the reactive gas.

In an experiment, reactive sputtering is performed in a chamber in vacuum or reduced pressure using a target, an inert gas and a reactive gas. While the power applied across the target and the flow rate of the inert gas are kept constant, the flow rate of the reactive gas is gradually increased from the zero gas feed state. As the flow rate of the reactive gas is increased, the sputtering voltage (i.e., target voltage) gradually declines. The voltage behavior is such that the voltage follows a slow decline (at a gentle slope) at the initial, a rapid decline (at a sharp slope) midway, and finally a slow decline (at a gentle slope) again. After the flow rate of the reactive gas is increased over the range where the voltage takes a slow decline again, inversely the flow rate of the reactive gas is decreased. As the flow rate of the reactive gas is decreased, the sputtering voltage (i.e., target voltage) gradually increases. At this stage, the voltage behavior is such that the voltage follows a slow increase (at a gentle slope) at the initial, a rapid increase (at a sharp slope) midway, and finally a slow increase (at a gentle slope) again. In the region of the rapid decline or increase (at a sharp slope), the sputtering voltage recorded during the ascent of reactive gas flow rate is not coincident with the sputtering voltage recorded during the descent of reactive gas flow rate, specifically the sputtering voltage recorded during the descent of reactive gas flow rate is lower.

In another experiment, reactive sputtering is performed in a chamber in vacuum or reduced pressure using a target and a reactive gas. While the power applied across the target and the flow rate of the inert gas are kept constant, the flow rate of the reactive gas is gradually increased from the zero gas feed state. As the flow rate of the reactive gas is increased, the sputtering current (i.e., target current) gradually increases. The current, behavior is such that the current follows a slow increase (at a gentle slope) at the initial, a rapid increase (at a sharp slope) midway, and finally a slow increase (at a gentle slope) again. After the flow rate of the reactive gas is increased over the range where the current takes a slow increase again, inversely the flow rate of the reactive gas is decreased. As the flow rate of the reactive gas is decreased, the sputtering current (i.e., target current) gradually declines. At this stage, the current behavior is such that the current follows a slow decline (at a gentle slope) at the initial, a rapid decline (at a sharp slope) midway, and finally a slow decline (at a gentle slope) again. In the region of the rapid increase or decline (at a sharp slope), the sputtering current recorded during the ascent of reactive gas flow rate is not coincident with the sputtering current recorded during the descent of reactive gas flow rate, specifically the sputtering current recorded during the descent of reactive gas flow rate is higher.

Figure 3:
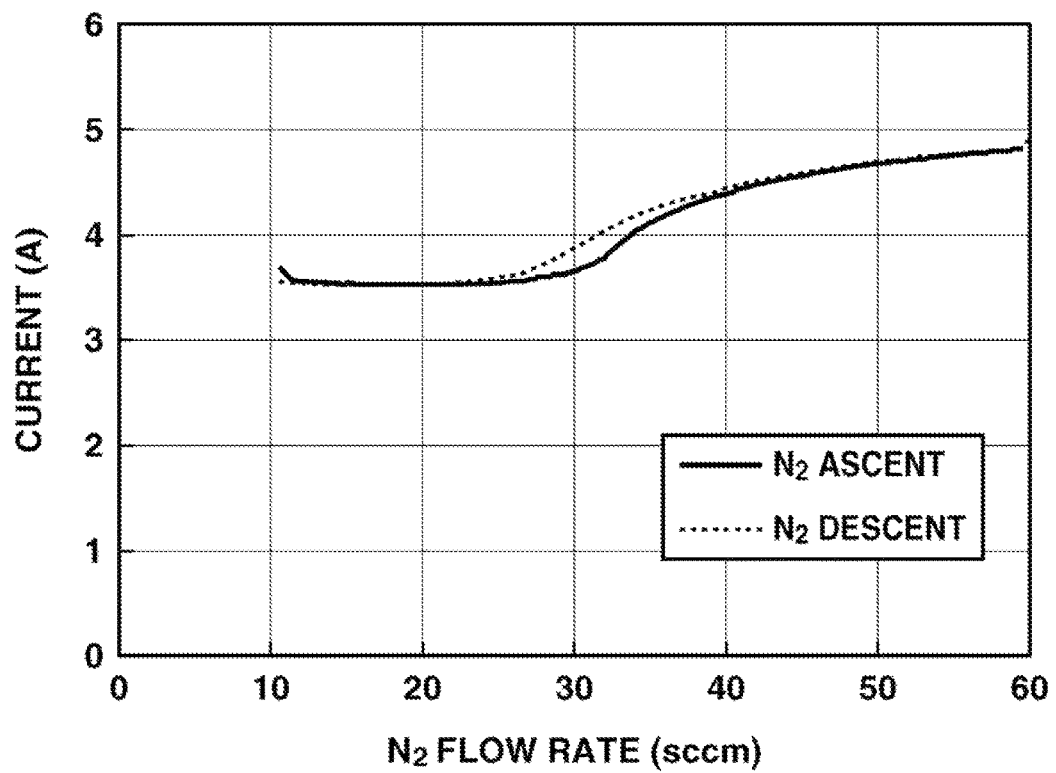
FIG. 3 is a diagram showing a hysteresis curve drawn in Example 1.
Figure 4:
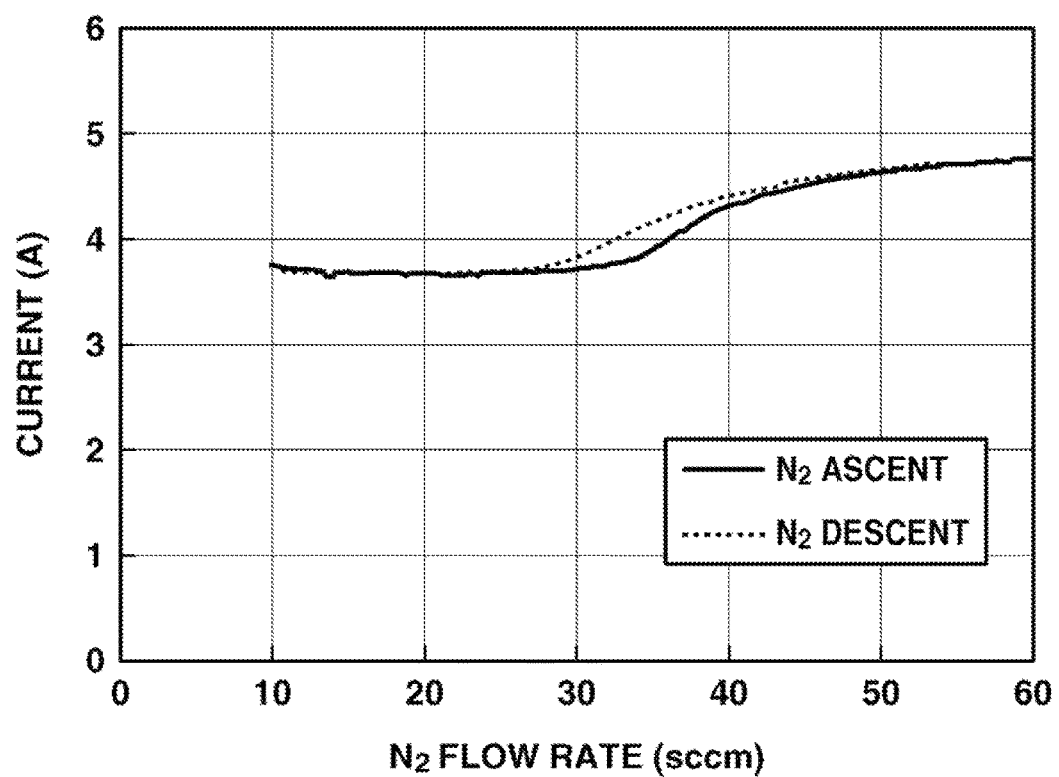
FIG. 4 is a diagram showing a hysteresis curve drawn in Example 3.

As is evident from the above reactive sputtering experiments, a hysteresis curve as shown in FIGS. 3 and 4, for example, and similar to the well-known magnetic hysteresis curve (B-H curve), is drawn by applying a constant power across the target, feeding an inert gas at a constant flow rate into a chamber, feeding the reactive gas into the chamber, increasing and then reducing the flow rate of the reactive gas for thereby sweeping the flow rate of the reactive gas, measuring a sputtering voltage or current value upon sweeping of the flow rate of the reactive gas, and plotting the sputtering voltage or current value versus the flow rate of the reactive gas, for the reason that the sputtering voltage or current value is not coincident between the ascent and the descent of reactive gas flow rate.

The hysteresis curve is delineated by the sputtering voltage or current recorded during the ascent of the reactive gas flow rate and the sputtering voltage or current recorded during the descent of the reactive gas flow rate. A hysteresis region is defined by the curve segments. In the hysteresis region, the lower and upper limits of the flow rate of reactive gas correspond to the points where the sputtering voltage or current value recorded during the ascent of reactive gas flow rate and the sputtering voltage or current value recorded during the descent of reactive gas flow rate become substantially coincident. Specifically, on the assumption that a percent change is determined from the formula (1-1):

$$(V_A-V_D)/\{(V_A+V_D)/2\} \times 100 \quad (1\text{-}1)$$

wherein $V_A$ is a sputtering voltage value recorded during the ascent of reactive gas flow rate and $V_D$ is a sputtering voltage value recorded during the descent of reactive gas flow rate, or a percent change is determined from the formula (1-2):

$$(I_D-I_A)/\{(I_A+I_D)/2\} \times 100 \quad (1\text{-}2)$$

wherein $I_A$ is a sputtering current value recorded during the ascent of reactive gas flow rate and $I_D$ is a sputtering current value recorded during the descent of reactive gas flow rate, the points when the percent change of formula (1-1) or (1-2) gradually decreases from the center of the hysteresis region toward the lower or upper limit side, and reaches 1% or less, especially substantially zero, are the lower and upper limits of the reactive gas flow rate in the hysteresis region (transition region).

As the sputtering voltage value $V_L$ at the lower limit of reactive gas flow rate in the hysteresis region and the sputtering voltage value $V_H$, at the upper limit of reactive gas flow rate in the hysteresis region, an average value of sputtering voltages recorded during the ascent of reactive gas flow rate and an average value of sputtering voltages recorded during the descent of reactive gas flow rate are applicable, respectively. Likewise, as the sputtering current value $I_L$ at the lower limit of reactive gas flow rate in the hysteresis region and the sputtering current value $I_H$ at the upper limit of reactive gas flow rate in the hysteresis region, an average value of sputtering currents recorded during the ascent of reactive gas flow rate and an average value of sputtering currents recorded during the descent of reactive gas flow rate are applicable, respectively.

In conjunction with the hysteresis curve, a region where the reactive gas flow rate is equal to or less than the lower limit of the hysteresis region is referred to as "metal mode", a region where the reactive gas flow rate is equal to or more than the upper limit of the hysteresis region is referred to as "reaction mode", and a region between the metal mode and the reaction mode is referred to as "transition mode." It is believed that during sputtering in the metal mode where the reactive gas flow rate is equal to or below the lower limit of the hysteresis region, the erosion portion of the target surface is maintained in the state not covered with the reaction product of reactive gas. During sputtering in the reaction mode where the reactive gas flow rate is equal to or above the upper limit of the hysteresis region, the target surface reacts with the reactive gas so that the target surface is completely covered with the reaction product of reactive gas. During sputtering in the transition mode where the reactive gas flow rate is above the lower limit and below the upper limit of the hysteresis region, the erosion portion of the target surface is partially covered with the reaction product of reactive gas.

The invention is most effective when there is obtained a hysteresis curve ensuring that a percent change of voltage determined from the sputtering voltage value $V_L$ at the lower limit of the reactive gas flow rate in the hysteresis region and the sputtering voltage value $V_H$ at the upper limit of the reactive gas flow rate in the hysteresis region according to the formula (2-1):

$$(V_L-V_H)/\{(V_L+V_H)/2\} \times 100 \quad (2\text{-}1)$$

or a percent change of current determined from the sputtering current value $I_L$ at the lower limit of the reactive gas flow rate in the hysteresis region and the sputtering current value $I_H$ at the upper limit of the reactive gas flow rate in the hysteresis region according to the formula (2-2):

$$(I_H-I_L)/\{(I_L+I_H)/2\} \times 100 \quad (2\text{-}2)$$

is at least 5%, especially at least 15%.

Also the invention is most effective when there is obtained a hysteresis curve ensuring that the difference (in absolute value) between the sputtering voltage value $V_A$ recorded during the ascent of the reactive gas flow rate and the sputtering voltage value $V_D$ recorded during the descent of the reactive gas flow rate as averages between the lower and upper limits of the reactive gas flow rate in the hysteresis region is at least 5%, especially at least 10% of the difference (in absolute value) between the sputtering voltage value $V_L$ at the lower limit of the reactive gas flow rate in the hysteresis region and the sputtering voltage value $V_H$ at the upper limit of the reactive gas flow rate in the hysteresis region; or the difference (in absolute value) between the sputtering current value $I_A$ recorded during the ascent of the reactive gas flow rate and the sputtering current value $I_D$ recorded during the descent of the reactive gas flow rate as averages between the lower and upper limits of the reactive gas flow rate in the hysteresis region is at least 5%, especially at least 10% of the difference (in absolute value) between the sputtering current value $I_L$ at the lower limit of the reactive gas flow rate in the hysteresis region and the sputtering current value $I_H$ at the upper limit of the reactive gas flow rate in the hysteresis region.

It is noted that in both the metal and reaction modes, the sputtering voltage current value recorded during the ascent of the reactive gas flow rate is substantially coincident with the sputtering voltage or current value recorded during the descent of the reactive gas flow rate.

For the photomask blank, the in-plane uniformity of a film is important. As the halftone phase shift film, a film containing silicon is generally used. Oxygen, nitrogen or the like must be added to the silicon containing film in order to provide the film with a certain transmittance. To form a silicon-containing film having a predetermined phase shift and a predetermined transmittance, the film must be sputter deposited in the transition mode. Film deposition in the transition mode, however, tends to degrade in-plane uniformity.

According to the invention, the method for preparing a halftone phase shift photomask blank involves the step of depositing a layer containing silicon and nitrogen. The step of depositing a layer containing silicon and nitrogen includes a transition mode sputtering step of sputtering in a sputtering state in a region corresponding to a range from more than the lower limit of reactive gas flow rate providing the hysteresis to less than the upper limit. In a part or the entirety, preferably the entirety of the transition mode sputtering step, at least one parameter selected from the power applied across the target, the flow rate of the inert gas, and the flow rate of the reactive gas, especially the flow rate of the reactive gas is increased or decreased continuously or stepwise, preferably continuously, so that the composition of the silicon/nitrogen-containing layer is graded in thickness direction. In this way, the halftone phase shift film is formed. With respect to halftone phase shift films containing silicon and nitrogen, especially transition metal-free films, for example, SiN films and SiON films, especially SiN films, it is difficult in the prior art that a film meeting a predetermined phase shift and transmittance, specifically a phase shift of 170 to 190° and a transmittance of 2 to 15% relative to exposure light of wavelength 193 nm and having high in-plane uniformity is deposited to a thickness of up to 70 nm, especially up to 67 nm. However, when sputter deposition is performed under the conditions defined herein, a halftone phase shift film having improved in-plane uniformity of optical properties such as phase shift and transmittance is obtained. Specifically the halftone phase shift film is improved such that the difference between maximum and minimum of phase shift in its in-plane distribution is up to 3°, preferably up to 2°, and more preferably up to 1°, and the difference between maximum and minimum of transmittance in its in-plane distribution is up to 5%, preferably up to 4%, and more preferably up to 3% of the in-plane average.

In a preferred embodiment wherein the step of depositing a layer containing silicon and nitrogen is solely a transition mode sputtering step, a film having better in-plane uniformity is obtainable. For example, in the case of a film, especially SiN film, having a phase shift of 170 to 190° relative to exposure light, a halftone phase shift film having a transmittance of 3 to 15% relative to exposure light may be deposited.

Although it is difficult in the prior art to form a silicon/nitrogen-containing film having in-plane uniformity of optical properties such as phase shift and transmittance, the method of the invention makes it possible to form a halftone phase shift film having a phase shift of 170 to 190°, specifically 175 to 185°, most specifically substantially 180° and a transmittance of up to 30%, specifically up to 15%, more specifically up to 10%, and at least 2%, specifically at least 3%, more specifically at least 5%, relative to exposure light of wavelength up to 250 nm, especially up to 200 nm, typically ArF excimer laser light (wavelength 193 nm) and featuring better in-plane uniformity of such optical properties. In the invention, parameters for sputter deposition include flow rates of reactive gases such as nitrogen gas and oxygen gas, flow rates of inert gases such as argon gas, helium gas and neon gas, especially argon gas, and a power applied across the target for sputtering.

In a preferred embodiment, the step of depositing a silicon/nitrogen-containing layer further includes a reaction mode sputtering step of sputtering in a sputtering state in a region corresponding to a range equal to or above the upper limit of reactive gas flow rate providing the hysteresis. Specifically, the transition mode sputtering step is followed by the reaction mode sputtering step, or the reaction mode sputtering step is followed by the transition mode sputtering step. By involving the reaction mode sputtering step in the step of depositing a silicon/nitrogen-containing layer, a halftone phase shift film having a higher transmittance may be deposited. For example, in the case of a film, especially SiN film, having a phase shift of 170 to 190° relative to exposure light, the reaction mode sputtering step, if involved, makes it possible to deposit a halftone phase shift film having a transmittance of 5 to 15% relative to exposure light.

In a preferred embodiment, in a part or the entirety, more preferably the entirety of the reaction mode sputtering step, at least one parameter selected from the power applied across the target, the flow rate of the inert gas, and the flow rate of the reactive gas, especially the flow rate of the reactive gas is increased or decreased continuously or stepwise, more preferably continuously, preferably so that the composition of the silicon/nitrogen-containing layer is graded in thickness direction. Preferably, a transfer from the transition mode sputtering step to the reaction mode sputtering step, or a transfer from the reaction mode sputtering step to the transition mode sputtering step is made continuous without interrupting the sputtering discharge because a film having better adhesion can be formed.

From the transition mode sputtering step to the reaction mode sputtering step, or from the reaction mode sputtering step to the transition mode sputtering step, especially at the step-to-step boundary, further especially throughout the steps, sputtering is preferably carried out while at least one parameter selected from the power applied across the target, the flow rate of inert gas, and the flow rate of reactive gas is increased or decreased continuously.

In another preferred embodiment, the step of depositing a silicon/nitrogen-containing layer further includes a metal mode sputtering step of sputtering in a sputtering state in a region corresponding to a range equal to or below the lower limit of reactive gas flow rate providing the hysteresis. Specifically, the metal mode sputtering step is followed by the transition mode sputtering step, or the transition mode sputtering step is followed by the metal mode sputtering step. By involving the metal mode sputtering step in the step of depositing a silicon/nitrogen-containing layer, a halftone phase shift film having a lower transmittance may be deposited. For example, in the case of a film, especially SiN film, having a phase shift of 170 to 190° relative to exposure light, the metal mode sputtering step, if involved, makes it possible to deposit a halftone phase shift film having a transmittance of 2 to 10% relative to exposure light.

In a preferred embodiment, in a part or the entirety, more preferably the entirety of the metal mode sputtering step, at least one parameter selected from the power applied across the target, the flow rate of the inert gas, and the flow rate of the reactive gas, especially the flow rate of the reactive gas is increased or decreased continuously or stepwise, more preferably continuously, preferably so that the composition of the silicon/nitrogen-containing layer is graded in thickness direction. Preferably, a transfer from the transition mode sputtering step to the metal mode sputtering step, or a transfer from the metal mode sputtering step to the transition mode sputtering step is made continuous without interrupting the sputtering discharge because a film having better adhesion can be formed.

From the transition mode sputtering step to the metal mode sputtering step, or from the metal mode sputtering step to the transition mode sputtering step, especially at the step-to-step boundary, further especially throughout the steps, sputtering is preferably carried out while at least one parameter selected from the power applied across the target, the flow rate of inert gas, and the flow rate of reactive gas is increased or decreased continuously.

The silicon/nitrogen-containing layer in the halftone phase shift film is constructed of a material containing silicon and nitrogen. The material containing silicon and nitrogen is preferably a silicon base material containing at least 90 at %, more preferably at least 94 at % of silicon and nitrogen in total. The silicon base material may further contain oxygen, carbon or another element, with lower contents of oxygen and carbon being preferred, and should preferably be free of transition metals. Exemplary silicon base materials include SiN, SiON, SiNC, and SiONC. Preferably the silicon/nitrogen-containing layer is of SiN consisting of silicon and nitrogen or SiON consisting of silicon, oxygen and nitrogen, because of further improvements in chemical resistance and resistance to laser irradiation. Most preferably, the layer is of SiN because the film may be reduced in thickness.

The silicon/nitrogen-containing layer in the halftone phase shift film is deposited by the sputtering method capable of forming a film of homogeneity while either DC sputtering or RF sputtering may be employed. The target and sputtering gas may be selected as appropriate depending on the arrangement and composition of layers. Suitable targets are silicon-containing targets including a silicon target (or Si target), a silicon nitride target, and a target containing silicon and silicon nitride. Inter alia, silicon-based targets, specifically targets having a silicon content of at least 90 at % are preferred, with the silicon target being most preferred. The content of nitrogen and the contents of oxygen and carbon may be adjusted by using a nitrogen-containing gas and optionally, an oxygen-containing gas, nitrogen/oxygen-containing gas or carbon-containing gas as the reactive gas, and adjusting the flow rate of such gas during reactive sputtering. Suitable reactive gases include nitrogen gas ($N_2$ gas), oxygen gas ($O_2$ gas), nitrogen oxide gases ($N_2O$ gas, NO gas, $NO_2$ gas), and carbon oxide gases (CO gas, $CO_2$ gas). The reactive gas essential as a nitrogen source is preferably nitrogen gas. In the sputtering gas, a rare gas such as helium, neon or argon gas may be used as the inert gas. The preferred inert gas is argon gas. The sputtering pressure is typically 0.01 to 1 Pa, preferably 0.03 to 0.2 Pa.

The halftone phase shift photomask blank of the invention may be prepared by forming a halftone phase shift film on a transparent substrate and heat treating or annealing at a temperature of at least 400° C. for at least 5 minutes. The heat treatment of the halftone phase shift film after deposition is preferably by heating the halftone phase shift film as deposited on the substrate at a temperature of at least 400° C., more preferably at least 450° C. for a time of at least 5 minutes, more preferably at least 30 minutes. The heat treatment temperature is preferably up to 900° C., more preferably up to 700° C., and the heat treatment time is preferably up to 24 hours, more preferably up to 12 hours. Heat treatment may be performed in the sputtering chamber or after transfer from the sputtering chamber to a heat treatment furnace. The heat treatment atmosphere may be an inert gas atmosphere such as helium gas or argon gas, vacuum, or even an oxygen-containing atmosphere such as oxygen gas atmosphere.

The halftone phase shift film may include a surface oxidized layer as the outermost layer (surface side of the film remote from the substrate) in order to suppress any change in quality of the film. The surface oxidized layer may have an oxygen content of at least 20 at %, with even an oxygen content of at least 50 at % being acceptable. The surface oxidized layer may be formed by atmospheric or air oxidation or forced oxidative treatment. Examples of forced oxidative treatment include treatment of a silicon-based material film with ozone gas or ozone water, and heating of a film at 300° C. or higher in an oxygen-containing atmosphere such as oxygen gas atmosphere by oven heating, lamp annealing or laser heating. The surface oxidized layer preferably has a thickness of up to 10 nm, more preferably up to 5 nm, and even more preferably up to 3 nm. The oxidized layer exerts its effect as long as its thickness is at least 1 nm. Although the surface oxidized layer may also be formed by increasing the amount of oxygen in the sputtering gas during the sputtering step, atmospheric oxidation or oxidative treatment after deposition is preferred for forming a less defective layer.

While the halftone phase shift photomask blank is defined as having a halftone phase shift film (as defined above) on a transparent substrate, the substrate is not particularly limited in its type and size. The transparent substrate is typically a quartz substrate which is transparent to the wavelength of commonly used exposure light. Preference is given to transparent substrates of 6 inch squares and 25 mil thick, known as 6025 substrate, as prescribed in the SEMI standards, or transparent substrates of 152 mm squares and 6.35 mm thick when expressed in the SI units. The halftone phase shift photomask has a (photo)mask pattern of the halftone phase shift film.

Figure 1B:
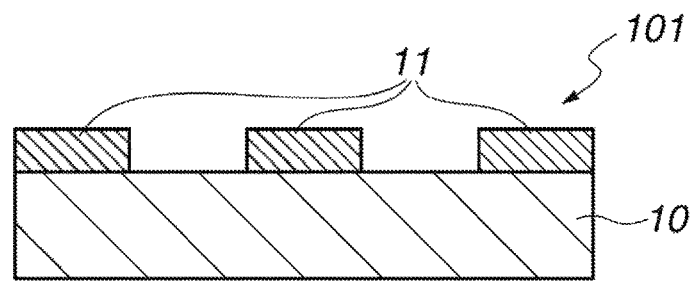

FIG. 1A is a cross-sectional view of a halftone phase shift photomask blank in one embodiment of the invention. The halftone phase shift photomask blank 100 includes a transparent substrate 10 and a halftone phase shift film 1 formed thereon. FIG. 1B is a cross-sectional view of a halftone phase shift photomask in one embodiment of the invention. The halftone phase shift photomask 101 includes a transparent substrate 10 and a halftone phase shift film pattern 11 thereon.

The exposure light used herein is preferably light of wavelength 250 nm or shorter, especially 200 nm or shorter, such as ArF excimer laser light (wavelength 193 nm) or $F_2$ laser light (wavelength 157 nm), with the ArF excimer laser light (193 nm) being most preferred.

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is 150 to 200 degrees. Although ordinary halftone phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 170 to 190°, more preferably 175 to 185°, and most preferably approximately 180°. The halftone phase shift film has a transmittance of exposure light which is preferably at least 2%, more preferably at least 3%, even more preferably at least 5%, and up to 30%, more preferably up to 15%, even more preferably up to 10%.

The (overall) thickness of the halftone phase shift film should preferably be up to 70 nm, more preferably up to 67 nm, even more preferably up to 65 nm, and most preferably up to 62 nm, because a thinner film facilitates to form a finer pattern. The lower limit of the film thickness is set in the range where the desired optical properties are obtained relative to exposure light. Most often the film thickness is set at least 40 nm, though the lower limit is not critical.

The halftone phase shift film should preferably have a refractive index n of at least 2.3, more preferably at least 2.5, and even more preferably at least 2.6 with respect to the exposure light as the overall halftone phase shift film excluding the surface oxidized layer if any. By reducing the oxygen content of a halftone phase shift film (if the silicon/nitrogen-containing layer contains oxygen), preferably by eliminating oxygen from the film, or by eliminating transition metal from the film, the refractive index n of the film can be increased while maintaining the predetermined transmittance, and the thickness of the film can be reduced while maintaining the necessary phase shift for the phase shift function. Moreover, the refractive index n becomes higher as the oxygen content is lower, and the necessary phase shift is available from a thinner film as the refractive index n is higher.

The halftone phase shift film should preferably have an extinction coefficient k of at least 0.2, especially at least 0.4, and up to 1.0, especially up to 0.7 with respect to the exposure light as the overall halftone phase shift film excluding the surface oxidized layer if any.

While the halftone phase shift film includes the silicon/nitrogen-containing layer (defined above) as a part or the entirety thereof, the silicon/nitrogen-containing layer preferably includes a region where an atomic ratio of nitrogen to the sum of silicon and nitrogen, N/(Si+N), varies continuously or stepwise, preferably continuously, in thickness direction, more preferably a region where an atomic ratio of nitrogen to the sum of silicon and nitrogen, N/(Si+N), varies in a range of at least 0.25, especially at least 0.34 and up to 0.57, especially up to 0.54 continuously or stepwise, preferably Continuously, in thickness direction. The region may also be referred to as a compositionally graded region. The halftone phase shift film of such construction is especially improved in in-plane uniformity and can be formed by the inventive method.

In a preferred embodiment of the halftone phase shift film, the overall halftone phase shift film excluding the surface oxidized layer if any is constructed by the silicon/nitrogen-containing layer, which preferably includes a region where the atomic ratio N/(Si+N) varies in the above-specified range continuously or stepwise, more preferably continuously, in thickness direction.

In the embodiment wherein the halftone phase shift film includes the silicon/nitrogen-containing layer which includes a region where an atomic ratio of nitrogen to the sum of silicon and nitrogen, N/(Si+N), varies continuously or stepwise, preferably continuously, in thickness direction, it is more preferred that the difference between maximum and minimum of the atomic ratio N/(Si+N) in thickness direction is up to 0.25, especially up to 0.15. The halftone phase shift film of such construction is especially improved in adhesion and can be formed by the inventive method.

The structure of the halftone phase shift film that the silicon/nitrogen-containing layer includes a region where an atomic ratio of nitrogen to the sum of silicon and nitrogen varies continuously in thickness direction encompasses that the silicon/nitrogen-containing layer includes a compositionally continuously graded region; the structure of the halftone phase shift film that the silicon/nitrogen-containing layer includes a region where an atomic ratio of nitrogen to the sum of silicon and nitrogen varies stepwise in thickness direction encompasses that the silicon/nitrogen-containing layer includes a compositionally stepwise graded region. The compositionally graded region in the silicon/nitrogen-containing layer encompasses both a region where silicon or nitrogen increases or decreases linearly, and a region where silicon or nitrogen increases and decreases in a zigzag way.

The silicon/nitrogen-containing layer in the halftone phase shift film is formed of a silicon base material containing silicon and nitrogen. The silicon base material is preferably a silicon base material containing at least 90 at %, more preferably at least 94 at % of silicon and nitrogen in total. Although the silicon base material may contain oxygen, the content of oxygen is preferably up to 10 at %, especially up to 6 at %. The silicon base material should preferably have a lower oxygen content and more preferably be free of oxygen, in order to form a thinner film. It is preferred from this standpoint that the silicon/nitrogen-containing layer include a layer of a material consisting of silicon and nitrogen (SiN) and more preferably be a layer of a material consisting of silicon and nitrogen (SiN).

Also preferably, the silicon base material is free of transition metals such molybdenum, zirconium, tungsten, titanium, hafnium, chromium and tantalum. The use of such silicon base material overcomes the problem of pattern size variation degradation associated with transition metal-containing silicon base materials and improves chemical resistance during chemical cleaning.

The silicon/nitrogen-containing layer in the halftone phase shift film is preferably formed in its entirety (excluding the surface oxidized layer if any) of a silicon base material having a silicon content of at least 35 at %, especially at least 43 at % and up to 80 at %, especially up to 75 at %.

The silicon/nitrogen-containing layer in the halftone phase shift film is preferably formed in its entirety (excluding the surface oxidized layer if any) of a silicon base material having a nitrogen content of at least 20 at %, especially at least 25 at % and up to 60 at %, especially up to 57 at %.

The silicon/nitrogen-containing layer in the halftone phase shift film is preferably formed in its entirety (excluding the surface oxidized layer if any) of a silicon base material having an oxygen content of up to 10 at %, more preferably up to 6 at %, especially up to 1 at %.

With respect to the construction of the halftone phase shift film, a film including a portion (on the surface side) remote from the substrate which has a low silicon content is effective for improving chemical resistance, and a film including a portion (on the surface side) remote from the substrate or a portion (on the substrate side) close to the substrate which has a low silicon content is effective for reducing reflectivity. On the other hand, from the standpoint of controllability such as precision of end detection during etching of the halftone phase shift film, it is preferred that a portion close to the substrate have a high silicon content.

The halftone phase shift film may be constructed by multiple layers as long as the benefits of the invention are obtainable. Where the halftone phase shift film includes a silicon/nitrogen-containing layer as a part, the balance may be a layer or layers other than the silicon/nitrogen-containing layer. Where the halftone phase shift film is a multilayer film, it may be a combination of two or more layers selected from layers composed of different constituents and layers composed of identical constituents in different compositional ratios. Where the halftone phase shift film is constructed by three or more layers, a combination of identical layers is acceptable as long as they are not contiguous to each other. The halftone phase shift film composed of layers consisting of identical constituents is advantageous in that it can be etched with a common etchant.

The halftone phase shift film may be composed of a single layer or multiple layers as long as a phase shift and a transmittance necessary for the halftone phase shift function are met. For example, the film may be composed of multiple layers including an antireflective function layer so that the overall film may meet a predetermined surface reflectance as well as the necessary phase shift and transmittance.

In the halftone phase shift photomask blank of the invention, a second film of single layer or multilayer structure may be formed on the halftone phase shift film. Most often, the second film is disposed contiguous to the halftone phase shift film. Examples of the second film include a light-shielding film, a combination of light-shielding film and antireflective film, and an auxiliary film which functions as a hard mask during subsequent pattern formation of the halftone phase shift film. When a third film is formed as will be described later, the second film may be utilized as an auxiliary film (etching stop film) which functions as an etching stopper during subsequent pattern formation of tho third film. The second film is preferably composed of a chromium-containing material.

Figure 2A:
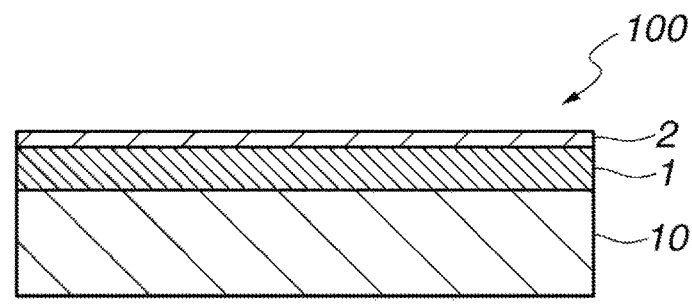
FIGS. 2A, 2B and 2C are cross-sectional views of further embodiments of the halftone phase shift photomask blank of the invention.

One exemplary embodiment is a halftone phase shift photomask blank illustrated in FIG. 2A. The halftone phase shift photomask blank depicted at 100 in FIG. 2A includes a transparent substrate 10, a halftone phase shift film 1 formed on the substrate, and a second film 2 formed on the film 1.

The halftone phase shift photomask blank may include a light-shielding film as the second film on the halftone phase shift film. A combination of a light-shielding film and an antireflective film may also be used as the second film. The provision of the second film including a light-shielding film ensures that a halftone phase shift photomask includes a region capable of completely shielding exposure light. The light-shielding film and antireflective film may also be utilized as an auxiliary film during etching. The construction and material of the light-shielding film and antireflective film are known from many patent documents, for example, Patent Document 4 (JP-A 2007-033469) and Patent Document 5 (JP-A 2007-233179). One preferred film construction of the light-shielding film and antireflective film is a structure having a light-shielding film of Cr-containing material and an antireflective film of Cr-containing material for reducing reflection by the light-shielding film. Each of the light-shielding film and the antireflective film may be a single layer or multilayer. Suitable Cr-containing materials of which the light-shielding film and antireflective film are made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

The chromium base light-shielding film and chromium base antireflective film may be deposited by reactive sputtering using a chromium target or a chromium target having one or more of oxygen, nitrogen and carbon added thereto, and a sputtering gas based on a rare gas such as Ar, He or Ne, Lo which a reactive gas selected from oxygen containing gas, nitrogen-containing gas and carbon-containing gas is added depending on the desired composition of a film to be deposited.

Where the second film is a light-shielding film or a combination of a light-shielding film and an antireflective film, the light-shielding film is made of a chromium base material having a chromium content of at least 30 at %, especially at least 35 at % and less than 100 at %, preferably up to 99 at %, and more preferably up to 90 at %. The chromium base material has an oxygen content of at least 0 at % and up to 60 at %, preferably up to 50 at %, with an oxygen content of at least 1 at % being preferred when an etching rate must be adjusted. The chromium base material has a nitrogen content of at least 0 at % and up 50 at %, preferably up to 40 at %, with a nitrogen content of at least 1 at % being preferred when an etching rate must be adjusted. The chromium base material has a carbon content of at least 0 at % and up to 30 at %, preferably up to 20 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a combination of a light-shielding film and an antireflective film, the antireflective film is preferably made of a chromium-containing material having a chromium content of preferably at least 30 at %, more preferably at least 35 at % and preferably up to 70 at %, and more preferably up to 50 at %. The chromium-containing material preferably has an oxygen content of up to 60 at %, and at least 1 at % and more preferably at least 20 at %. The chromium-containing material preferably has a nitrogen content of up to 50 at %, more preferably up to 30 at %, and at least 1 at %, more preferably at least 3 at %. The chromium-containing material preferably has a carbon content of at least 0 at % and up to 30 at %, more preferably up to 20 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is a light-shielding film or a combination of a light-shielding film and an antireflective film, the second film has a thickness of typically 20 to 100 nm, preferably 40 to 70 nm. Also the halftone phase shift film combined with the second film should preferably have a total optical density of at least 2.0, more preferably at least 2.5, and even more preferably at least 3.0, with respect to exposure light of wavelength up to 250 nm, especially up to 200 nm.

In the halftone phase shift photomask blank of the invention, a third film of single layer or multilayer structure may be formed on the second film. Most often, the third film is disposed contiguous to the second film. Examples of the third film include a light-shielding film, a combination of light-shielding film and antireflective film, and an auxiliary film which functions as a hard mask during subsequent pattern formation of the second film. The third film is preferably composed of a silicon-containing material, especially chromium-free silicon-containing material.

Figure 2B:
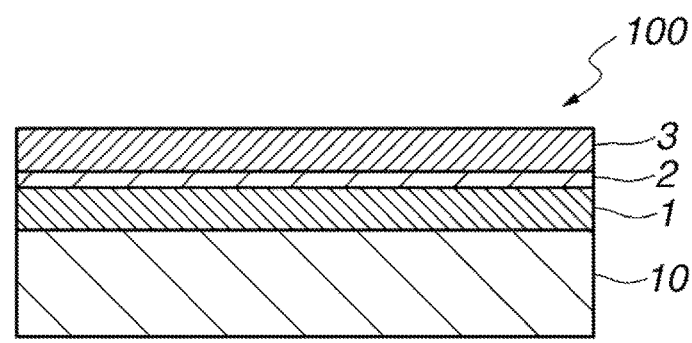

One exemplary embodiment is a halftone phase shift photomask blank illustrated in FIG. 2B. The halftone phase shift photomask blank depicted at 100 in FIG. 2B includes a transparent substrate 10, a halftone phase shift film 1 formed on the substrate, a second film 2 formed on the film 1, and a third film 3 formed on the second film 2.

Where the second film is a light-shielding film or a combination of a light-shielding film and an antireflective film, the third film may be an auxiliary film (etching mask film) which functions as a hard mask during subsequent pattern formation of the second film. When a fourth film is formed as will be described later, the third film may be utilized as an auxiliary film (etching stop film) which functions as an etching stopper during subsequent pattern formation of the fourth film. The auxiliary film is preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and one or both of nitrogen and oxygen, a material containing silicon and a transition metal, and a material containing silicon, one or both of nitrogen and oxygen, and a transition metal. Exemplary of the transition metal are molybdenum, tantalum and zirconium.

Where the third film is an auxiliary film, it is preferably composed of a silicon-containing material having a silicon content of preferably at least 20 at %, more preferably at least 33 at % and up to 95 at %, more preferably up to 80 at %. The silicon-containing material has a nitrogen content of at least 0 at % and up to 50 at %, preferably up to 40 at %, with a nitrogen content of at least 1 at % being preferred when an etching rate must be adjusted. The silicon-containing material has an oxygen content of at least 0 at %, preferably at least 20 at % and up to 70 at %, preferably up to 66 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is a light-shielding film or a combination of a light-shielding film and an antireflective film and the third film is an auxiliary film, the second film has a thickness of typically 20 to 100 nm, preferably 40 to 70 nm, and the third film has a thickness of typically 1 to 30 nm, preferably 2 to 15 nm. Also the halftone phase shift film combined with the second film should preferably have a total optical density of at least 2.0, more preferably at least 2.5, and even more preterably at least 3.0, with respect to exposure light of wavelength up to 250 nm, especially up to 200 nm.

Where the second film is an auxiliary film, a light-shielding film may be formed as the third film. Also, a combination of a light-shielding film and an antireflective film may be formed as the third film. Herein the second film may be utilized as an auxiliary film (etching mask film) which functions as a hard mask during pattern formation of the halftone phase shift film, or an auxiliary film (etching stop film) which functions as an etching stopper during pattern formation of the third film. Examples of the auxiliary film are films of chromium-containing materials as described in Patent Document 6 (JP-A 2007-241065). The auxiliary film may be a single layer or multilayer. Suitable chromium-containing materials of which the auxiliary film is made include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the second film is an auxiliary film, the film preferably has a chromium content of preferably at least 30 at %, more preferably at least 35 at % and up to 100 at %, more preferably up to 99 at %, and even more preferably up to 90 at %. The film has an oxygen content of at least 0 at %, and up to 60 at %, preferably up to 55 at %, with an oxygen content of at least 1 at % being preferred when an etching rate must be adjusted. The film has a nitrogen content of at least 0 at %, and up to 50 at %, preferably up to 40 at %, with a nitrogen content of at least 1 at % being preferred when an etching rate must be adjusted. The film has a carbon content of at least 0 at % and up to 30 at %, preferably up to 20 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

On the other hand, the light shielding film and antireflective film as the third film are preferably composed of a material having different etching properties from the second film, for example, a material having resistance to chlorine dry etching applied to the etching of chromium-containing material, specifically a silicon-containing material which can be etched with fluoride gas such as $SF_6$ or $CF_4$. Suitable silicon-containing materials include silicon alone, a material containing silicon and nitrogen and/or oxygen, a material containing silicon and a transition metal, and a material containing silicon, nitrogen and/or oxygen, and a transition metal. Exemplary of the transition metal are molybdenum, tantalum and zirconium.

Where the third film is a light-shielding film or a combination of a light-shielding film and an antireflective film, the light-shielding film and antireflective film are preferably composed of a silicon-containing material having a silicon content of preferably at least 10 at %, more preferably at least 30 at % and less than 100 at %, more preferably up to 95 at %. The silicon-containing material has a nitrogen content of at least 0 at % and up to 50 at %, preferably up to 40 at %, especially up to 20 at %, with a nitrogen content of at least 1 at % being preferred when an etching rate must be adjusted. The silicon-containing material has an oxygen content of at least 0 at %, and up to 60 at %, preferably up to 30 at %, with an oxygen content of at least 1 at % being preferred when an etching rate must be adjusted. The silicon-containing material has a transition metal content of at least 0 at % and up to 35 at %, preferably up to 20 at %, with a transition metal content of at least 1 at % being preferred if present. The total content of silicon, oxygen, nitrogen and transition metal is preferably at least 95 at %, more preferably at least 99 at %, and especially 100 at %.

Where the second film is an auxiliary film and the third film is a light-shielding film or a combination of a light-shielding film and an antireflective film, the second film has a thickness of typically 1 to 20 nm, preferably 2 to 10 nm, and the third film has a thickness of typically 20 to 100 nm, preferably 30 to 70 nm. Also the halftone phase shift film combined with the second and third films should preferably have a total optical density of at least 2.0, more preferably at least 2.5, and even more preferably at least 3.0, with respect to exposure light of wavelength up to 250 nm, especially up to 200 nm.

In the halftone phase shift photomask blank of the invention, a fourth film of single layer or multilayer structure may be formed on the third film. Most often, the fourth film is disposed contiguous to the third film. Exemplary of the fourth film is an auxiliary film which functions as a hard mask during subsequent pattern formation of the third film. The fourth film is preferably composed of a chromium-containing material.

Figure 2C:
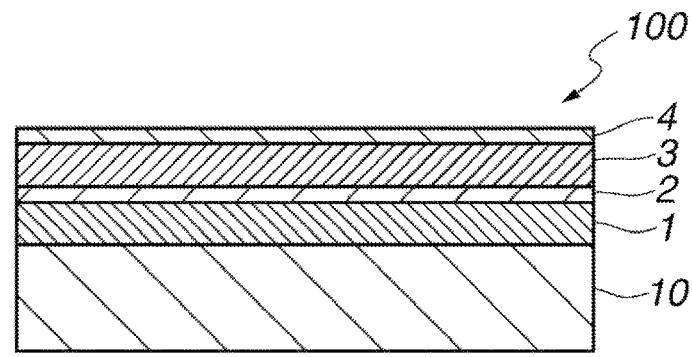

One exemplary embodiment is a halftone phase shift photomask blank illustrated in FIG. 2C. The halftone phase shift photomask blank depicted at 100 in FIG. 2C includes a transparent substrate 10, a halftone phase shift film 1 formed on the substrate, a second film 2 formed on the film 1, a third film 3 formed on the second film 2, and a fourth film 4 formed on the third film 3.

Where the third film is a light-shielding film or a combination of a light-shielding film and an antireflective film, the fourth film may be an auxiliary film (etching mask film) which functions as a hard mask during subsequent pattern formation of the third film. The auxiliary film is preferably composed of a material having different etching properties from the third film, for example, a material having resistance to fluorine dry etching applied to the etching of silicon-containing material, specifically a chromium-containing material which can be etched with oxygen-containing chloride gas. Suitable chromium-containing materials include chromium alone, chromium oxide (CrO), chromium nitride (CrN), chromium carbide (CrC), chromium oxynitride (CrON), chromium oxycarbide (CrOC), chromium nitride carbide (CrNC), chromium oxynitride carbide (CrONC) and other chromium compounds.

Where the fourth film is an auxiliary film, the film has a chromium content of at least 30 at %, preferably at least 35 at % and up to 100 at %, preferably up to 99 at %, and more preferably up to 90 at %. The film has an oxygen content of at least 0 at % and up to 60 at %, preferably up to 40 at %, with an oxygen content of at least 1 at % being preferred when an etching rate must be adjusted. The film has a nitrogen content of at least 0 at % and up to 50 at %, preferably up to 40 at %, with a nitrogen content of at least 1 at % being preferred when an etching rate must be adjusted. The film has a carbon content of at least 0 at % and up to 30 at %, preferably up to 20 at %, with a carbon content of at least 1 at % being preferred when an etching rate must be adjusted. The total content of chromium, oxygen, nitrogen and carbon is preferably at least 95 at %, more preferably at least 99 at %, and especially 100 at %.

Where the second film is an auxiliary film, the third film is a light-shielding film or a combination of a light-shielding film and an antireflective film, and the fourth film is an auxiliary film; the second film has a thickness of typically 1 to 20 nm, preferably 2 to 10 nm, the third film has a thickness of typically 20 to 100 nm, preferably 30 to 70 nm, and the fourth film has a thickness of typically 1 to 30 nm, preferably 2 to 20 nm. Also the halftone phase shift film combined with the second and third films should preferably have a total optical density of at least 2.0, more preferably at least 2.5, and even more preferably at least 3.0, with respect to exposure light of wavelength up to 250 nm, especially up to 200 nm.

The second and fourth films of chromium-containing materials may be deposited by reactive sputtering using a chromium target or a chromium target having one or more of oxygen, nitrogen and carbon added thereto, and a sputtering gas based on a rare gas such as Ar, He or Ne, to which a reactive gas selected from oxygen-containing gas, nitrogen-containing gas and carbon-containing gas is added depending on the desired composition of a film to be deposited.

The third film of silicon-containing material may be deposited by reactive sputtering using a silicon target, silicon nitride target, target containing silicon and silicon nitride, transition metal target, or composite silicon/transition metal target, and a sputtering gas based on a rare gas such as Ar, He or Ne, to which a reactive gas selected from oxygen-containing gas, nitrogen-containing gas and carbon-containing gas is added depending on the desired composition of a film to be deposited.

The photomask blank may be processed into a photomask by a standard technique. For example, a halftone phase shift photomask blank comprising a halftone phase shift film and a second film of chromium-containing material deposited thereon may be processed as follows. First, a resist film adapted for electron beam (EB) lithography is formed on the second film of the halftone phase shift photomask blank, exposed to a pattern of EB, and developed in a conventional way, forming a resist pattern. While the resist pattern thus obtained is used as etching mask, oxygen-containing chlorine base dry etching is carried out for transferring the resist pattern to the second film, obtaining a pattern of the second film. Next, while the second film pattern is used as etching mask, fluorine base dry etching is carried out for transferring the pattern to the halftone phase shift film, obtaining a pattern of the halftone phase shift film. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift photomask.

In another example, a halftone phase shift photomask blank comprising a halftone phase shift film, a light-shielding film or a light-shielding film/antireflective film of chromium-containing material deposited thereon as a second film, and an auxiliary film of silicon-containing material deposited thereon as a third film may be processed as follows. First, a resist film adapted for EB lithography is formed on the third film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, obtaining a pattern of the second film. The resist pattern is removed at this point. Further, while the second film pattern is used as etching mask, fluorine base dry etching is carried out for transferring the second film pattern to the halftone phase shift film to define a pattern of the halftone phase shift film and at the same time, removing the third film pattern. If any region of the second film is to be left, a resist pattern for protecting that region is formed on the second film. Thereafter, the portion of the second film which is not protected with the resist pattern is removed by oxygen-containing chlorine base dry etching. The resist pattern is removed in a conventional manner, yielding a halftone phase shift photomask.

In a further example, a halftone phase shift photomask blank comprising a halftone phase shift film, an auxiliary film of chromium-containing material deposited thereon as a second film, and a light-shielding film or a light-shielding film/antireflective film of silicon-containing material deposited on the second film as a third film may be processed as follows. First, a resist film adapted for EB lithography is formed on the third film of the halftone phase shift photomask blank, exposed to a pattern of EB, and developed in a conventional way, forming a resist pattern. While the resist pattern thus obtained is used as etching mask, fluorine base dry etching is carried out for transferring the resist pattern to the third film, obtaining a pattern of the third film. While the third film pattern thus obtained is used as etching mask, oxygen-containing chlorine base dry etching is carried out for transferring the third film pattern to the second film, whereby a pattern of the second film is obtained, that is, a portion of the second film where the halftone phase shift film is to be removed is removed. The resist pattern is removed at this point. A resist pattern for protecting a portion of the third film to be left is formed on the third film. Further, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed, yielding a halftone phase shift photomask.

In a still further example, a halftone phase shift photomask blank comprising a halftone phase shift film, an auxiliary film of chromium-containing material deposited thereon as a second film, a light-shielding film or a light-shielding film/antireflective film of silicon-containing material deposited on the second film as a third film, and an auxiliary film of chromium-containing material deposited on the third film as a fourth film may be processed as follows. First, a resist film adapted for EB lithography is formed on the fourth film of the halftone phase shift photomask blank, exposed to a pattern of EB, and developed in a conventional way, forming a resist pattern. While the resist pattern thus obtained is used as etching mask, oxygen-containing chlorine base dry etching is carried out for transferring the resist pattern to the fourth film, obtaining a pattern of the fourth film. While the fourth film pattern thus obtained is used as etching mask, fluorine base dry etching is carried out for transferring the fourth film pattern to the third film, obtaining a pattern of the third film. The resist pattern is removed at this point. A resist pattern for protecting a portion of the third film to be left is formed on the fourth film. Further, while the third film pattern is used as etching mask, oxygen-containing chlorine base dry etching is carried out for transferring the third film pattern to the second film, obtaining a pattern of the second film and at the same time, removing the portion of the fourth film which is not protected with the resist pattern. Next, while the second film pattern is used as etching mask, fluorine base dry etching is carried out for transferring the second film pattern to the halftone phase shift film to define a pattern of the halftone phase shift film and at the same time, removing the portion of the third film which is not protected with the resist pattern. The resist pattern is removed in a conventional manner. Finally, oxygen-containing chlorine base dry etching is carried out to remove the portion of the second film where the third film has been removed and the portion of the fourth film where the resist pattern has been removed, yielding a halftone phase shift photomask.

In a photolithographic method for forming a pattern with a half pitch of up to 50 nm, typically up to 30 nm, and more typically up to 20 nm on a processable substrate, comprising the steps of forming a photoresist film on the processable substrate and exposing the photoresist film to light of wavelength up to 250 nm, especially up to 200 nm, typically ArF excimer laser (wavelength 193 nm) or $F_2$ laser (157 nm), through a patterned mask for transferring the pattern to the photoresist film, the halftone phase shift photomask of the invention is best suited for use in the exposure step.

The halftone phase shift photomask obtained from the photomask blank is advantageously applicable to the pattern forming process comprising projecting light to the photomask pattern including the pattern of halftone phase shift film for transferring the photomask pattern to an object (photoresist film) on the processable substrate. The irradiation of exposure light may be either dry exposure or immersion exposure. The halftone phase shift photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto.

Example 1

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The current flow across the target was measured while the flow rate of nitrogen gas was changed, obtaining a hysteresis curve. Specifically, a power of 1.9 kW was applied across the target, argon gas was fed at 17 sccm, and nitrogen gas was fed at 10 sccm into the chamber. In this state, sputtering was started. The flow rate of nitrogen gas was increased from 10 sccm by an increment of 0.17 sccm every second and finally to 60 sccm. Thereafter, inversely the flow rate of nitrogen gas was reduced from 60 sccm by a decrement of 0.17 sccm every second and finally to 10 sccm. The current was plotted relative to the flow rate to draw a hysteresis curve as shown in FIG. 3. In FIG. 3, the solid-line curve represents the sputtering current recorded during the ascent of nitrogen gas flow rate and the broken-line curve represents the sputtering current recorded during the descent of nitrogen gas flow rate. A hysteresis region having upper and lower limits is defined between these curves.

Next, on the basis of the hysteresis curve of FIG. 3, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 17 sccm, and the flow rate of nitrogen gas was continuously increased from 10 sccm to 45 sccm. A halftone phase shift film of 64 nm thick was deposited. The halftone phase shift film was measured for phase shift and transmittance by a phase shift/transmittance measurement system MPM193 (Lasertec Corp., the same system used in the following measurement). The film had a phase shift of 172.4±0.6° and a transmittance of 5.1±0.1% with respect to light of wavelength 193 nm, and the in-plane distributions of phase shift and transmittance were narrow, indicating satisfactory in-plane uniformity. The halftone phase shift film was analyzed for composition by XPS, finding a substrate side composition of 66 at % Si and 34 at %, N, a surface side (remote from the substrate) composition of 46 at % Si and 54 at % N, and a continuously graded composition between the substrate side and the surface side.

Example 2

On the basis of the hysteresis curve of FIG. 3, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 17 sccm, and the flow rate of nitrogen gas was continuously changed from 45 sccm to 10 sccm. A halftone phase shift film of 69 nm thick was deposited. The halftone phase shift film had a phase shift of 178.0±0.3° and a transmittance of 4.5±0.1% with respect to light of wavelength 193 nm, and the in-plane distributions of phase shift and transmittance were narrow, indicating satisfactory in-plane uniformity. The halftone phase shift film was analyzed for composition by XPS, finding a substrate side composition of 46 at % Si and 54 at % N, a surface side composition of 68 at % Si and 32 at % N, and a continuously graded composition between the substrate side and the surface side.

Example 3

In a chamber of a sputtering system, a quartz substrate of 152 mm squares and 6.35 mm thick was placed. A silicon target was used as the sputter target, and argon and nitrogen gases were used as the sputtering gas. The power applied across the target and the flow rate of argon gas were kept constant. The current flow across the target was measured while the flow rate of nitrogen gas was changed, obtaining a hysteresis curve. Specifically, a power of 1.9 kW was applied across the target, argon gas was fed at 20.5 sccm, and nitrogen gas was fed at 10 sccm into the chamber. In this state, sputtering was started. The flow rate of nitrogen gas was increased from 10 sccm by an increment of 0.17 sccm every second and finally to 60 sccm. Thereafter, inversely the flow rate of nitrogen gas was reduced from 60 sccm by a decrement of 0.17 sccm every second and finally to 10 sccm. The current was plotted relative to the flow rate to draw a hysteresis curve as shown in FIG. 4. In FIG. 4, the solid-line curve represents the sputtering current recorded during the ascent of nitrogen gas flow rate and the broken-line curve represents the sputtering current recorded during the descent of nitrogen gas flow rate. A hysteresis region having upper and lower limits is defined between these curves.

Next, on the basis of the hysteresis curve of FIG. 4, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 20.5 sccm, and the flow rate of nitrogen gas was continuously changed from 23.8 sccm to 43.9 sccm. A halftone phase shift film of 64 nm thick was deposited. The halftone phase shift film had a phase shift of 177.1±0.9° and a transmittance of 5.1±0.1% with respect to light of wavelength 193 nm, and the in-plane distributions of phase shift and transmittance were narrow, indicating satisfactory in-plane uniformity. The halftone phase shift film was analyzed for composition by XPS, finding a substrate side composition of 51 at % Si and 49 N, a surface side (remote from the substrate) composition of 46 at % Si and 54 at % N, and a continuously graded composition between the substrate side and the surface side.

Example 4

On the basis of the hysteresis curve of FIG. 4, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 20.5 sccm, and the flow rate of nitrogen gas was continuously changed from 25.5 sccm to 45 sccm. A halftone phase shift film of 62 nm thick was deposited. The halftone phase shift film had a phase shift of 175.9±0.5° and a transmittance of 7.95±0.1% with respect to light of wavelength 193 nm, and the in-plane distributions of phase shift and transmittance were narrow, indicating satisfactory in-plane uniformity. The halftone phase shift film was analyzed for composition by XPS, finding a substrate side composition of 50 at % Si and 50 at % N, a surface side composition of 46 at % Si and 54 at % N, and a continuously graded composition between the substrate side and the surface side.

Example 5

On the basis of the hysteresis curve of FIG. 4, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 20.5 sccm, and the flow rate of nitrogen gas was continuously changed from 28.3 sccm to 45.0 sccm. A halftone phase shift film of 61 nm thick was deposited. The halftone phase shift film had a phase shift of 176.5±0.7° and a transmittance of 10.5±0.2% with respect to light of wavelength 193 nm, and the in-plane distributions of phase shift and transmittance were narrow, indicating satisfactory in-plane uniformity. The halftone phase shift film was analyzed for composition by XPS, finding a substrate side composition of 48 at % Si and 52 at % N, a surface side composition of 46 at % Si and 54 at % N, and a continuously graded composition between the substrate side and the surface side.

Comparative Example 1

On the basis of the hysteresis curve of FIG. 3, sputtering was performed on a quartz substrate of 152 mm squares and 6.35 mm thick, using a silicon target as the sputter target, and nitrogen and argon gases as the sputtering gas. Specifically, the power applied across the target was 1.9 kW, the flow rate of argon gas was 17 sccm, and the flow rate of nitrogen gas was kept constant at 28.6 sccm. A halftone phase shift film of 61 nm thick was deposited. The halftone phase shift film had a phase shift of 174.7±1.1° and a transmittance of 4.4±0.3% with respect to light of wavelength 193 nm. On XPS analysis, the composition of the halftone phase shift film was uniform in thickness direction.

Japanese Patent Application No. 2016-010666 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift photomask blank comprising a transparent substrate and a halftone phase shift film formed thereon, wherein
the halftone phase shift film includes as a part or the entirety thereof a layer containing silicon and nitrogen, said layer includes a region where an atomic ratio of nitrogen to the sum of silicon and nitrogen, N/(Si+N), continuously varies in a range between 0.25 and 0.57 in thickness direction.

2. The halftone phase shift photomask blank of claim 1 wherein the layer containing silicon and nitrogen includes a region where the atomic ratio of nitrogen to the sum of silicon and nitrogen, N/(Si+N), continuously varies in a range between 0.34 and 0.54 in thickness direction.

3. The halftone phase shift photomask blank of claim 1 wherein in the layer containing silicon and nitrogen, the difference between maximum and minimum of the atomic ratio of nitrogen to the sum of silicon and nitrogen, N/(Si+N), in thickness direction is up to 0.25.

4. The halftone phase shift photomask blank of claim 1 wherein the layer containing silicon and nitrogen is composed of SiN.

5. The halftone phase shift photomask blank of claim 1 wherein the layer containing silicon and nitrogen is free of transition metals.

6. A halftone phase shift photomask blank comprising a transparent substrate and a halftone phase shift film formed thereon, wherein
the halftone phase shift film includes as a part or the entirety thereof a layer containing silicon and nitrogen and being free of transition metals, exhibits a phase shift of 170 to 190° and a transmittance of 2 to 15% with respect to exposure light of wavelength 193 nm, a difference between maximum and minimum in phase shift in-plane distribution being up to 3°, and a difference between maximum and minimum in transmittance in-plane distribution being up to 5% based on in-plane average value, and the halftone phase shift film has a thickness of up to 67 nm.

7. The halftone phase shift photomask blank of claim 6 wherein the layer containing silicon and nitrogen and being free of transition metals includes a region where an atomic ratio of nitrogen to the sum of silicon and nitrogen continuously varies in thickness direction.

8. The halftone phase shift photomask blank of claim 7 wherein the layer containing silicon and nitrogen and being free of transition metals includes a region where the atomic ratio of nitrogen to the sum of silicon and nitrogen, $N/(Si+N)$, continuously varies in a range between 0.25 and 0.57 in thickness direction.

* * * * *